(12) United States Patent
Chen et al.

(10) Patent No.: US 10,396,186 B2
(45) Date of Patent: Aug. 27, 2019

(54) THIN FILM TRANSISTOR, METHOD FOR FABRICATING THE SAME, DISPLAY PANEL AND DISPLAY DEVICE

(71) Applicant: BOE TECHNOLOGY GROUP CO., LTD., Beijing (CN)

(72) Inventors: Jiangbo Chen, Beijing (CN); Quanhu Li, Beijing (CN); Jingang Fang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/736,799

(22) PCT Filed: Jul. 14, 2017

(86) PCT No.: PCT/CN2017/092974
§ 371 (c)(1),
(2) Date: Dec. 15, 2017

(87) PCT Pub. No.: WO2018/133344
PCT Pub. Date: Jul. 26, 2018

(65) Prior Publication Data
US 2018/0366565 A1    Dec. 20, 2018

(30) Foreign Application Priority Data

Jan. 18, 2017  (CN) ........................ 2017 1 0037590

(51) Int. Cl.
*H01L 29/66* (2006.01)
*H01L 21/443* (2006.01)
(Continued)

(52) U.S. Cl.
CPC .. *H01L 29/66969* (2013.01); *H01L 21/02164* (2013.01); *H01L 21/02274* (2013.01);
(Continued)

(58) Field of Classification Search
CPC ............... H01L 27/127; H01L 27/1288; H01L 27/1222; H01L 29/4908; H01L 29/66757; H01L 29/78666; H01L 21/0274
See application file for complete search history.

(56) References Cited

U.S. PATENT DOCUMENTS

2013/0207087 A1  8/2013  Kim et al.
2014/0042429 A1  2/2014  Park et al.
(Continued)

FOREIGN PATENT DOCUMENTS

CN   103247659 A   8/2013
CN   103579227 A   2/2014
(Continued)

OTHER PUBLICATIONS

Search Report for International Application No. PCT/CN2017/092974 dated Aug. 30, 2017.

*Primary Examiner* — Thanh Y. Tran
(74) *Attorney, Agent, or Firm* — Calfee, Halter & Griswold LLP

(57) ABSTRACT

A thin film transistor, a method for fabricating the same, a display panel and a display device are disclosed. The method includes forming an active layer on a substrate; forming an insulating layer on the active layer and an exposed surface of the substrate; forming a first conductive layer on the insulating layer; patterning the first conductive layer and the insulating layer to form a first stack on the active layer, wherein the first stack includes a first portion of the first conductive layer and a first portion of the insulating layer, the first stack acts as a gate stack and the active layer includes a channel region below the gate stack and a source region and a drain region at two sides of the channel region; and performing plasma treatment on the first conductive layer, the source region and the drain region, to improve conductivity.

19 Claims, 4 Drawing Sheets

(51) Int. Cl.
  *H01L 21/4763* (2006.01)
  *H01L 21/423* (2006.01)
  *H01L 29/786* (2006.01)
  *H01L 29/423* (2006.01)
  *H01L 29/49* (2006.01)
  *H01L 21/02* (2006.01)
  *H01L 27/12* (2006.01)
  *H01L 21/768* (2006.01)
  *H01L 29/24* (2006.01)
  *H01L 21/465* (2006.01)
  *H01L 27/32* (2006.01)

(52) U.S. Cl.
  CPC .. *H01L 21/02488* (2013.01); *H01L 21/02554* (2013.01); *H01L 21/02565* (2013.01); *H01L 21/02631* (2013.01); *H01L 21/423* (2013.01); *H01L 21/443* (2013.01); *H01L 21/465* (2013.01); *H01L 21/47635* (2013.01); *H01L 21/76802* (2013.01); *H01L 21/76877* (2013.01); *H01L 27/12* (2013.01); *H01L 27/127* (2013.01); *H01L 27/1225* (2013.01); *H01L 27/1248* (2013.01); *H01L 27/1262* (2013.01); *H01L 29/24* (2013.01); *H01L 29/42372* (2013.01); *H01L 29/4908* (2013.01); *H01L 29/786* (2013.01); *H01L 29/7869* (2013.01); *H01L 29/78603* (2013.01); *H01L 29/78633* (2013.01); *H01L 29/78696* (2013.01); *H01L 27/3262* (2013.01); *H01L 2227/323* (2013.01)

(56) References Cited

U.S. PATENT DOCUMENTS

2014/0061632 A1  3/2014  Lee et al.
2017/0323904 A1* 11/2017  Kim .................... H01L 27/1214

FOREIGN PATENT DOCUMENTS

CN    103681690 A    3/2014
CN    106128944 A    11/2016

* cited by examiner

US 10,396,186 B2

THIN FILM TRANSISTOR, METHOD FOR FABRICATING THE SAME, DISPLAY PANEL AND DISPLAY DEVICE

RELATED APPLICATIONS

The present application is the U.S. national phase entry of PCT/CN2017/092974, with an international filing date of Jul. 14, 2017, which claims the benefit of Chinese Patent Application No. 201710037590.9, filed on Jan. 18, 2017, the entire disclosures of which are incorporated herein by reference.

TECHNICAL FIELD

The present disclosure relates to the field of display technology, and particularly to a thin film transistor, a method for fabricating the same, a display panel, and a display device.

BACKGROUND

With the development of display technology, an oxide thin film transistor has been used widely due to advantages of high electron mobility, low fabrication temperature, and excellent homogeneity.

An organic light emitting diode (OLED) display is a display which emits light by itself. On basis of the driving manner, it can be divided into a passive matrix driving OLED (PMOLED) display and an active matrix driving OLED (AMOLED) display. The AMOLED display has been increasingly applied to various high performance display fields due to advantages of low cost, fast response, power saving, and a large operation temperature range.

SUMMARY

Embodiments of the present disclosure provide a thin film transistor, a method for fabricating the same, a display panel, and a display device, which improve performance of the thin film transistor and display effect.

In a first aspect of the present disclosure, a method for fabricating a thin film transistor is provided, which comprises: forming an active layer on a substrate; forming an insulating layer on the active layer and an exposed surface of the substrate; forming a first conductive layer on the insulating layer; patterning the first conductive layer and the insulating layer to form a first stack on the active layer, wherein the first stack comprises a first portion of the first conductive layer and a first portion of the insulating layer, the first stack acts as a gate stack of the thin film transistor, and the active layer comprises a channel region below the gate stack and a source region and a drain region at two sides of the channel region; and performing plasma treatment on the first conductive layer, the source region, and the drain region, to improve the conductivity of the first conductive layer, the source region, and the drain region.

In an embodiment, the first conductive layer comprises a conductive oxide, and the active layer comprises an oxide semiconductor material.

In an embodiment, the plasma treatment forms oxygen vacancy in the conductive oxide and the oxide semiconductor material.

In an embodiment, the plasma treatment uses argon plasma or helium plasma.

In an embodiment, the active layer has a thickness of about 10 nm-100 nm, and the first conductive layer has a thickness of about 50 nm-400 nm.

In an embodiment, the conductive oxide comprises at least one of indium tin oxide and gallium doped zinc oxide, and the oxide semiconductor material comprises at least one of indium gallium zinc oxide and indium tin zinc oxide.

In an embodiment, the plasma treatment comprises helium plasma treatment, and reaction conditions comprise: helium flux about 100-500 sccm, a pressure about 10-100 Pa, a power about 200-1000 W, and a treatment duration about 5-300 seconds.

In an embodiment, the reaction conditions comprise a helium flux about 200 sccm, a pressure about 50 Pa, a power about 600 W, and a treatment duration about 40 seconds.

In an embodiment, the method further comprises: prior to forming the active layer, forming a light shielding layer on the substrate; and forming a buffer layer on the substrate and the light shielding layer.

In an embodiment, the light shielding layer comprises a semiconductor material which has a band gap smaller than a band gap of the active layer.

In an embodiment, the light shielding layer comprises indium gallium zinc oxide, the active layer comprises indium gallium zinc oxide, and the light shielding layer has an oxygen concentration lower than an oxygen concentration of the active layer.

In an embodiment, the buffer layer comprises silicon oxide.

In an embodiment, the patterning further comprises forming a second stack on the substrate which is adjacent to the active layer, the second stack comprises a second portion of the first conductive layer and a second portion of the insulating layer, and the plasma treatment further treats the second portion of the first conductive layer.

In an embodiment, the method further comprises: forming an interlayer insulating layer to cover the substrate, the active layer, the first stack, and the second stack; patterning the interlayer insulating layer to form at a same time in the interlayer insulating layer a first through hole which exposes the source region, a second through hole which exposes the drain region, and a third through hole which exposes the second portion of the first conductive layer of the second stack; forming a second electrically conductive layer on the interlayer insulating layer to fill the first, second, and third through holes; patterning the second electrically conductive layer to form a first pad which is connected with the source region through the first through hole, a second pad which is connected with the drain region through the second through hole, and a third pad which is connected with the second portion of the first conductive layer through the third through hole; and forming a passivation layer on the interlayer insulating layer and the first, second, and third pads.

In an embodiment, the interlayer insulating layer is patterned with the plasma treatment.

In an embodiment, the interlayer insulating layer comprises silicon oxide, the second electrically conductive layer comprises metal or conductive oxide, and the passivation layer comprises silicon oxide or silicon nitride.

In a second aspect of the present disclosure, a thin film transistor is provided which is fabricated by the method in the first aspect of the present disclosure.

In a third aspect of the present disclosure, a display panel is provided which comprises the thin film transistor in the second aspect of the present disclosure.

In a fourth aspect of the present disclosure, a display device is provided, which comprises the display panel in the third aspect of the present disclosure.

In embodiments as described in this context, the plasma treatment on the first conductive layer and the source region and the drain region of the active layer improves the conductivity of the first conductive layer, the source region, and the drain region. Moreover, in the embodiment as described in this context, the light shielding layer has a band gap smaller than that of the active layer, so that it can prevent the effect of ambient light on the thin film transistor. Thus, the thin film transistor, the method for fabricating the same, the display panel, and the display device in embodiments of the present disclosure can improve performance of the thin film transistor device and display effect.

It will be understood that each aspect of the present disclosure can be implemented individually or in combination with one or more other aspect. Furthermore, the description and specific embodiments in this context only intends to elucidate, but not restrict, the protection scope of the present disclosure.

BRIEF DESCRIPTION OF THE DRAWINGS

To make the objects, the technical solutions and the advantages of embodiments of the present disclosure more apparent, the technical solutions of the embodiments of the present disclosure will be described in detail hereinafter in conjunction with the accompanying drawings, in which.

The same or similar reference numerals indicate the same or similar elements or features throughout views in these drawings.

DETAILED DESCRIPTION OF EMBODIMENTS

The terminology used herein is for the purpose of describing particular embodiments only and is not intended to be limiting of the invention. As used herein, the singular forms, "a", "an" and "the" are intended to include the plural forms as well, unless the context clearly indicates otherwise. It will be further understood that the terms "includes" and/or "including", when used in this specification, specify the presence of stated features, integers, steps, operations, elements, and/or components, but do not preclude the presence or addition of one or more other features, integers, steps, operations, elements, components, and/or groups thereof.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

Exemplary embodiments will be described in details with reference to the accompanying drawings.

In embodiments as described in this context, a thin film transistor, a method for fabricating the same, a display panel, and a display device are provided. By performing plasma treatment on the first (electrically) conductive layer and the source region and the drain region of the active layer, conductivity of the first conductive layer and the source region and the drain region of the active layer can be improved. Moreover, in the embodiment as described in this context, the light shielding layer has a band gap smaller than that of the active layer, so that it can prevent the effect of ambient light on the thin film transistor. Thus, performance of the thin film transistor device and display effect can be improved. The method for fabricating a thin film transistor in embodiments of the present disclosure will be described by referring to FIGS. 1-10.

Figure 1:
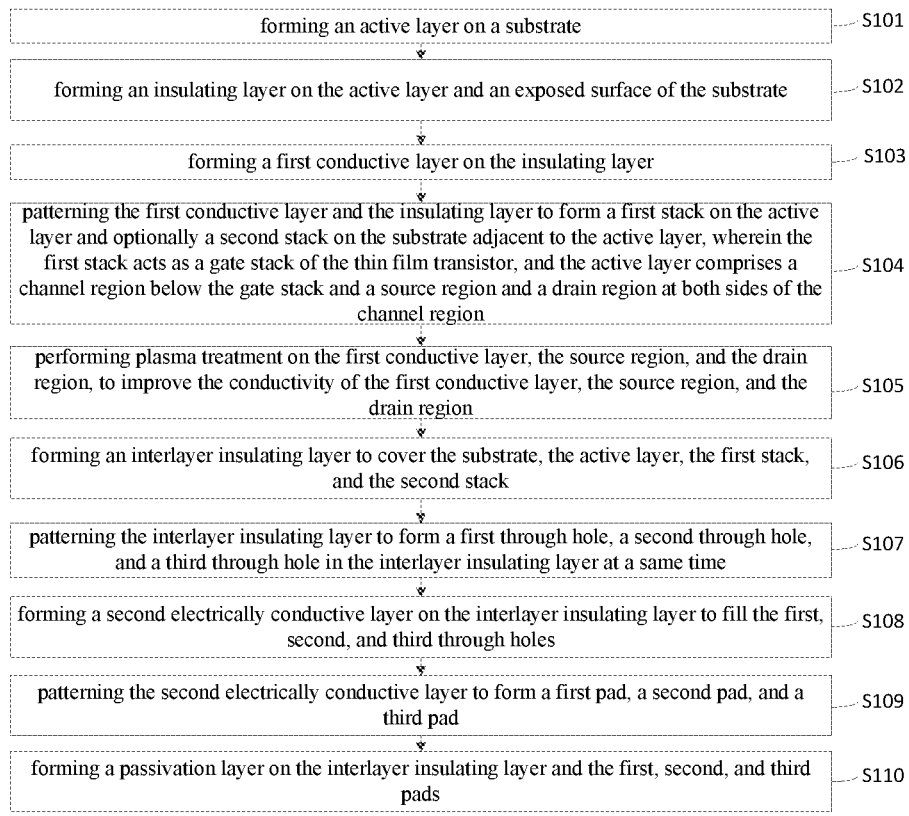
FIG. 1 is a flow chart for illustrating a method for fabricating a thin film transistor in an embodiment of the present disclosure.
Figure 2:
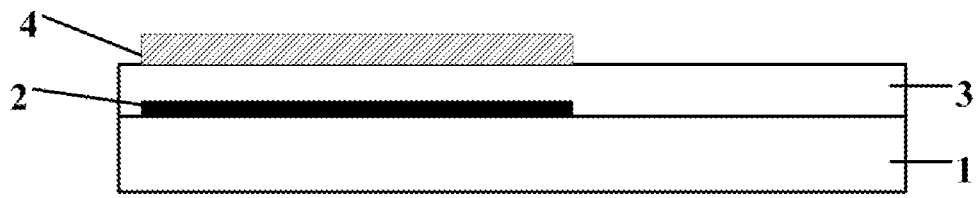
FIG. 2 is a schematic view for illustrating forming an active layer in the method according to an embodiment of the present disclosure.

FIG. 1 is a flow chart of a method for fabricating a thin film transistor according to an embodiment of the present disclosure. As shown in FIG. 1, step S101 comprises forming an active layer on a substrate. FIG. 2 further schematically shows a schematic view for forming an active layer 4.

In an exemplary embodiment, as shown in FIG. 2, step S101 further comprises forming a patterned light shielding layer 2 a substrate 1; and forming a buffer layer 3 on the substrate 1 and the light shielding layer 2. Then, a patterned active layer 4 is formed on the buffer layer 3.

In an exemplary embodiment, a method for forming the light shielding layer 2 comprises sputtering or evaporation. In an exemplary embodiment, when sputtering is used, the reaction conditions comprise an argon flux about 100 sccm, an oxygen flux about 0.13 sccm, a pressure about 0.63 Pa, and a DC power about 4.5 kw. In an exemplary embodiment, during forming the light shielding layer 2, the oxygen flux percentage is about 0-5%. In an exemplary embodiment, the light shielding layer 2 comprises a semiconductor material. In particular, the light shielding layer 2 comprises an oxide semiconductor material. In an exemplary embodiment, the light shielding layer 2 has a thickness about 10-500 nm.

In an exemplary embodiment, a method for forming the buffer layer 3 comprises plasma enhanced chemical vapor deposition (PECVD). In an exemplary embodiment, the buffer layer 3 comprises silicon oxide. In an exemplary embodiment, the buffer layer 3 has a thickness about 100-500 nm. The thickness indicates a thickness from a bottom surface of the buffer layer 3 which contacts the substrate 1 to a top surface of the buffer layer 3.

In an exemplary embodiment, a method for forming the active layer 4 comprises sputtering or evaporation. In an exemplary embodiment, when sputtering is used, the reaction conditions comprise an argon flux about 100 sccm, an oxygen flux about 0.63 sccm, a pressure about 0.77 Pa, and a DC power about 4.5 kw. In an exemplary embodiment, during forming the active layer 4, the oxygen flux percentage is about 10-50%. In an exemplary embodiment, the active layer 4 comprises an oxide semiconductor material. In an exemplary embodiment, the active layer 4 has a band gap larger than the light shielding layer 2. In an exemplary embodiment, the active layer 4 has a thickness about 10-100 nm.

In an exemplary embodiment, the oxide semiconductor material comprises at least one of indium gallium zinc oxide (IGZO) and indium tin zinc oxide (ITZO).

In an exemplary embodiment, the light shielding layer 2 comprises indium gallium zinc oxide, the active layer 4 comprises indium gallium zinc oxide, and the light shielding layer 2 has an oxygen concentration lower than that of the active layer 4.

The light shielding layer is generally a metallic layer for shielding light. In embodiments of the present disclosure, the light shielding layer is an oxide semiconductor material, which is transparent and has a band gap smaller than that of the active layer. It can prevent the effect of ambient light and effectively absorb ultraviolet light and near blue or violet light which has remarkable effect on the active layer. As compared with the metallic layer, the oxide semiconductor material improves the transmittance of the whole display device.

Figure 3:
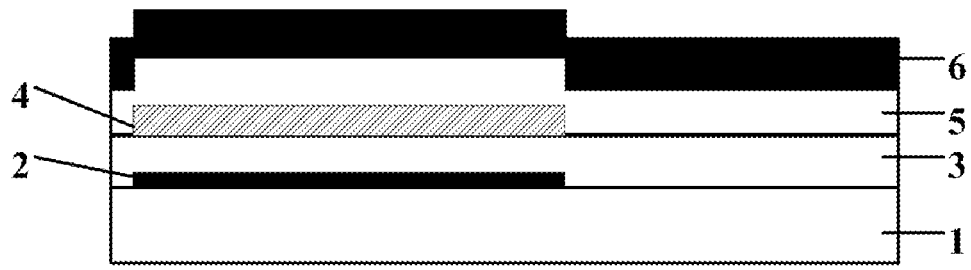
FIG. 3 is a schematic view for illustrating forming an insulating layer and a first conductive layer in the method according to an embodiment of the present disclosure.

As shown in FIG. 1, step S102 comprises forming an insulating layer on the active layer and an exposed surface of the substrate, and FIG. 3 further schematically shows a schematic view for forming an the insulating layer 5.

In particular, as shown in FIG. 3, the insulating layer 5 is formed on the active layer 4 and an exposed surface of the substrate 1. In an exemplary embodiment, a method for forming the insulating layer 5 comprises PECVD. In an exemplary embodiment, the insulating layer 5 comprises silicon oxide. In an exemplary embodiment, the insulating layer 5 has a thickness about 100-500 nm.

As shown in FIG. 1, step S103 comprises forming a first conductive layer on the insulating layer. FIG. 3 further schematically shows a schematic view for forming a first conductive layer 6.

In particular, as shown in FIG. 3, the first conductive layer 6 is formed on the insulating layer 5. In an exemplary embodiment, a method for forming the first conductive layer 6 comprises sputtering or evaporation. In an exemplary embodiment, the first conductive layer 6 comprises a conductive oxide. In an exemplary embodiment, the conductive oxide comprises at least one of indium tin oxide (ITO) and gallium doped zinc oxide (GZO). In an exemplary embodiment, the first conductive layer 6 has a thickness about 50-400 nm.

Figure 4:
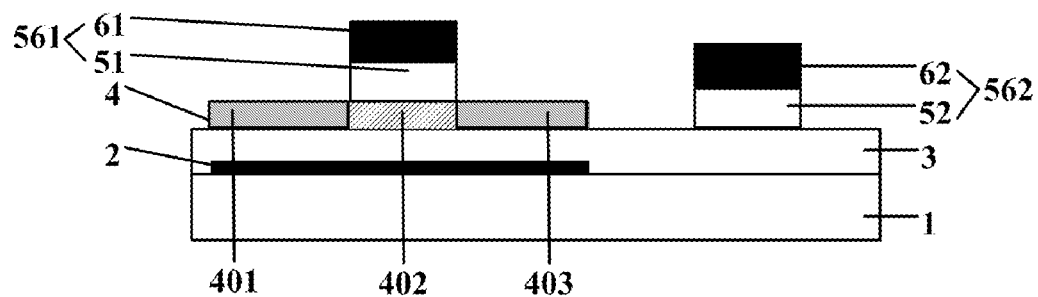
FIG. 4 is a schematic view for illustrating forming a first stack in the method according to an embodiment of the present disclosure.

As shown in FIG. 1, step S104 comprises patterning the first conductive layer and the insulating layer to form a first stack on the active layer, wherein the first stack acts as a gate stack of the thin film transistor, and the active layer comprises a channel region below the gate stack and a source region and a drain region at both sides of the channel region. FIG. 4 further schematically shows a schematic view for forming a first stack 561.

In an exemplary embodiment, patterning further comprises forming a second stack 562 on the substrate 1 which is adjacent to the active layer 4.

In particular, as shown in FIG. 4, firstly, the first conductive layer 6 is patterned by e.g., wet etching to form a first portion 61 and a second portion 62 of the first conductive layer 6. Then, by using the first portion 61 and the second portion 62 of the first conductive layer 6 as a mask, the insulating layer 5 is patterned by e.g., wet etching to form a first portion 51 and a second portion 52 of the insulating layer 5.

In an exemplary embodiment, the first portion 61 of the first conductive layer 6 and the first portion 51 of the insulating layer 5 form the first stack 561, and the second portion 62 of the first conductive layer 6 and the second portion 52 of the insulating layer 5 form the second stack 562.

In an exemplary embodiment, the first stack 561 is a gate stack of the thin film transistor according to embodiments of the present disclosure, a portion of the active layer 4 below the gate stack is a channel region 402, and the portions of active layer at two sides of the channel region 402 are a source region 401 and a drain region 403, respectively.

Figure 5:
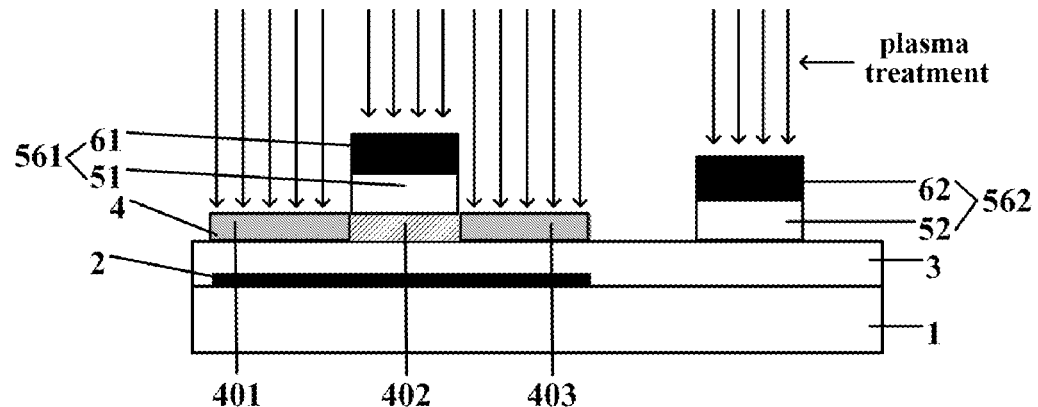
FIG. 5 is a schematic view for illustrating performing plasma treatment in the method according to an embodiment of the present disclosure.

As shown in FIG. 1, step S105 comprises performing plasma treatment on the first conductive layer, the source region, and the drain region, to improve the conductivity of the first conductive layer, the source region, and the drain region. FIG. 5 further schematically shows a schematic view for performing plasma treatment.

In particular, as shown in FIG. 5, by using plasma, plasma treatment is performed on the first portion 61 of the first conductive layer 6, the source region 401, and the drain region 403.

In an exemplary embodiment, the plasma treatment is further performed on the second portion 62 of the first conductive layer 6.

In an exemplary embodiment, the plasma comprises argon plasma or helium plasma.

In an exemplary embodiment, the plasma treatment comprises helium plasma treatment, the reaction conditions comprise a helium flux about 100-500 sccm, a pressure about 10-100 Pa, a power about 200-1000 W, and a treatment duration about 5-300 seconds.

In an exemplary embodiment, as for the helium plasma treatment, the reaction conditions comprise a helium flux about 200 sccm, a pressure about 50 Pa, a power about 600 W, and a treatment duration about 40 seconds.

In the embodiment, the first portion 61 and the second portion 62 of the first conductive layer 6, the source region 401 and the drain region 403 are bombarded with helium plasma, so that the oxide material lose oxygen atoms and form more oxygen vacancy defects. This improves conductivity, so that the thin film transistor is optimized. This improves performance of a thin film transistor device and display effect. Furthermore, by performing plasma treatment on the first portion 61 and the second portion 62 of the first conductive layer 6, the source region 401, and the drain region 403 at a same time, the process steps and the cost can be reduced.

Figure 6:
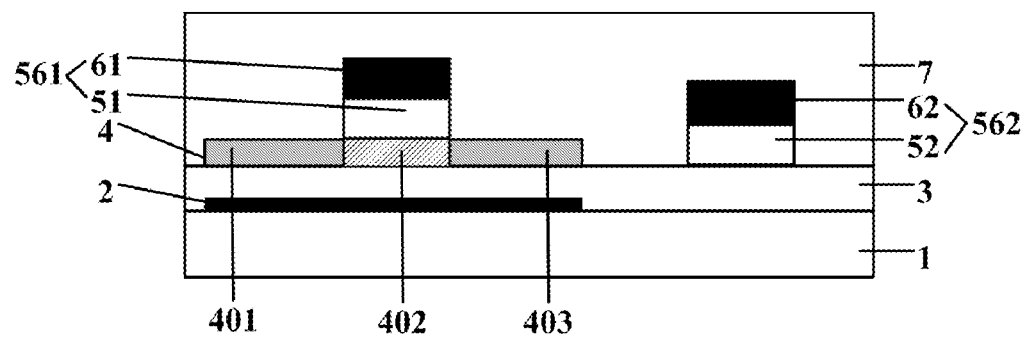
FIG. 6 is a schematic view for illustrating forming an interlayer insulating layer in the method according to an embodiment of the present disclosure.

As shown in FIG. 1, step S106 comprises forming an interlayer insulating layer to cover the substrate, the active layer, the first stack, and the second stack. FIG. 6 further schematically shows a schematic view for forming an interlayer insulating layer 7.

As shown in FIG. 6, the interlayer insulating layer 7 is formed to cover the substrate 1, the active layer 4, the first stack 561 and the second stack 562. In an exemplary embodiment, a method for forming the interlayer insulating layer 7 comprises PECVD. In an exemplary embodiment, the interlayer insulating layer 7 comprises silicon oxide. In an exemplary embodiment, the interlayer insulating layer 7 has a thickness about 100-500 nm.

Figure 7:
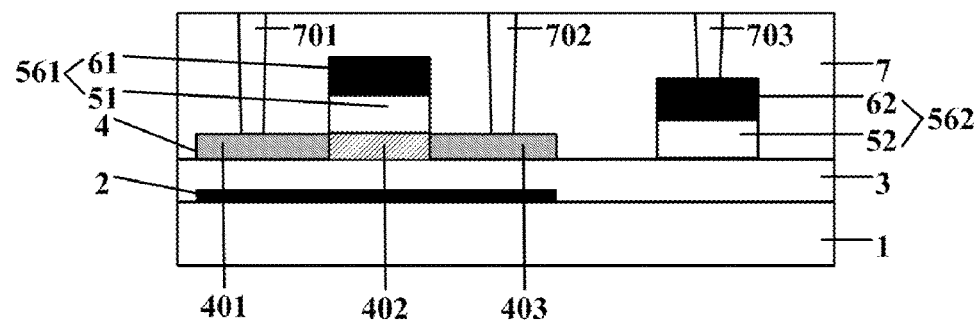
FIG. 7 is a schematic view for illustrating forming first, second, and third through holes in the method according to an embodiment of the present disclosure.

As shown in FIG. 1, step S107 comprises patterning the interlayer insulating layer to form a first through hole, a second through hole, and a third through hole in the interlayer insulating layer at a same time. FIG. 7 further schematically shows a schematic view for forming a first through hole 701, a second through hole 702, and a third through hole 703.

In particular, as shown in FIG. 7, the interlayer insulating layer 7 is patterned to form at a same time the first through hole 701 which exposes the source region 401, the second through hole 702 which exposes the drain region 403, and the third through hole 703 which exposes the second portion 62 of the first conductive layer 6 in the second stack 562.

In an exemplary embodiment, by for example patterning for one time, the first, second, and third through holes are formed at a same time. For example, when dry etching is used for patterning, since the second portion 62 of the first conductive layer 6 comprises at least one of ITO and GZO, instead of a metal, the second portion 62 will not be damaged even when a through hole with a depth exceeding the second portion 62. In particular, in an exemplary embodiment, the plasma treatment is also used, which can increase conductivity of the first conductive layer 6. In this way, during forming the through hole, the second portion 62 will not be damaged, and conductivity of the second portion 62 can be further increased.

In an exemplary embodiment, the second portion 62 of the first conductive layer 6 in the second stack 562 is a data line which provides signal to the first portion 61 of the first conductive layer 6 in the first stack 561. In particular, when the first portion 61 is a gate of the thin film transistor, the second portion 62 is a gate wiring which provide a signal to the gate.

Figure 8:
FIG. 8 is a schematic view for illustrating forming a second electrically conductive layer in the method according to an embodiment of the present disclosure.

As shown in FIG. 1, step S108 comprises forming a second electrically conductive layer on the interlayer insulating layer to fill the first, second, and third through holes. FIG. 8 further schematically shows a schematic view for forming a second electrically conductive layer 8.

In particular, as shown in FIG. 8, the second electrically conductive layer 8 is formed on the interlayer insulating layer 7 to fill the first through hole 701, the second through hole 702 and the third through hole 703. In an exemplary embodiment, the method for forming the second electrically conductive layer 8 comprises sputtering. In an exemplary embodiment, the second electrically conductive layer 8 comprises a metal or conductive oxide. In an exemplary embodiment, the second electrically conductive layer 8 comprises Cu, Ag, Al or ITO. In an exemplary embodiment, the second electrically conductive layer 8 has a thickness about 50-400 nm. The thickness indicates a thickness from a bottom surface of the second electrically conductive layer 8 which contacts the top surface of the interlayer insulating layer 7 to a top surface of the second electrically conductive layer 8.

Figure 9:
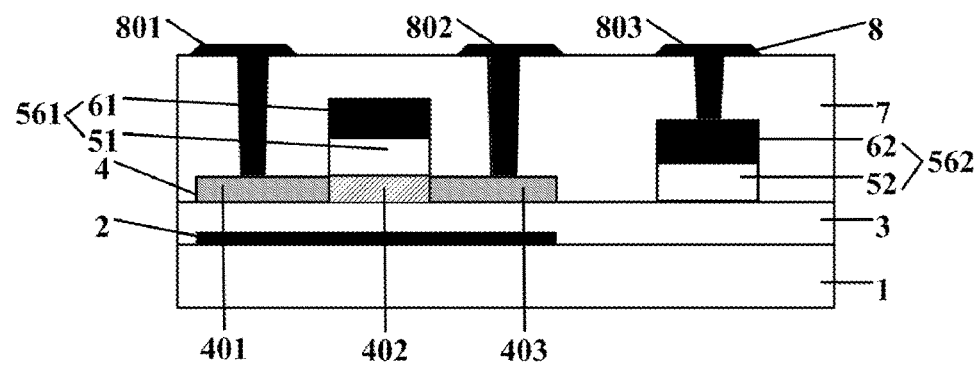
FIG. 9 is a schematic view for illustrating forming first, second, and third pads in the method according to an embodiment of the present disclosure.

As shown in FIG. 1, step S109 comprises patterning the second electrically conductive layer to form a first pad, a second pad, and a third pad. FIG. 9 further schematically shows a schematic view for forming a first pad 801, a second pad 802, and a third pad 803.

In particular, as shown in FIG. 9, the second electrically conductive layer 8 is patterned to form the first pad 801 through the first through hole 701 which is connected with the source region 401, the second pad 802 which is connected with the drain region 403 through the second through hole 702, and the third pad 803 which is connected with the second portion 62 of the first conductive layer 6 through the third through hole 703.

Figure 10:
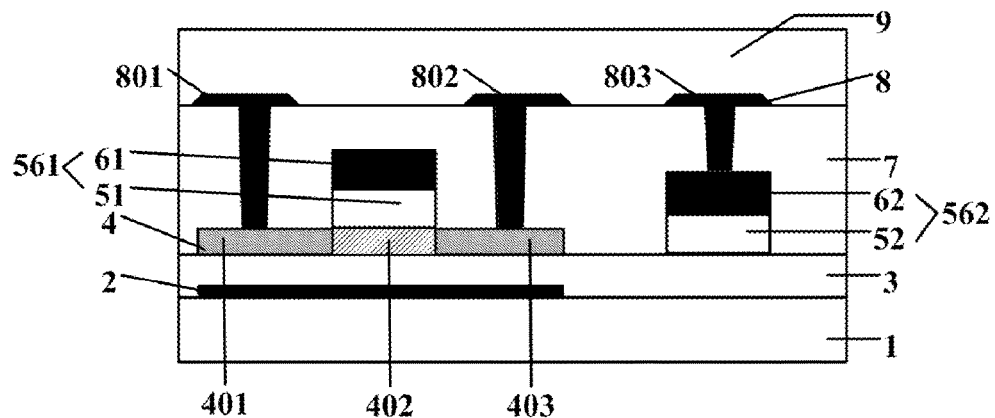
FIG. 10 is a schematic view for illustrating forming a passivation layer in the method according to an embodiment of the present disclosure.
Figure 11:
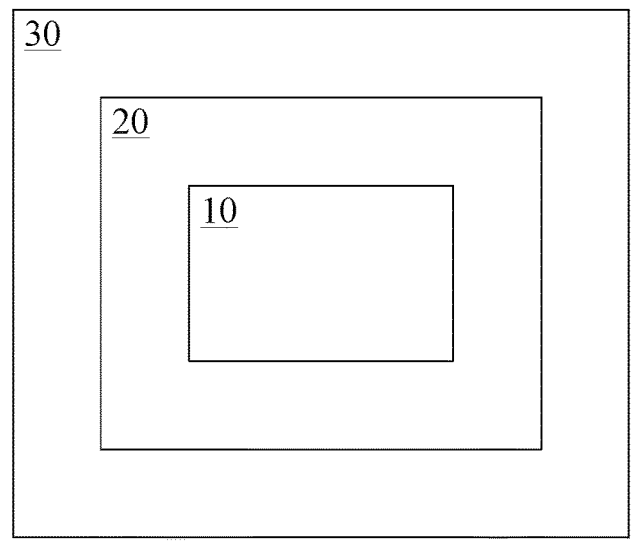
FIG. 11 is a structural view for illustrating a display device in an embodiment of the present disclosure.

As shown in FIG. 1, step S110 comprises forming a passivation layer on the interlayer insulating layer and the first, second, and third pads. FIG. 10 further schematically shows a schematic view for forming a passivation layer 9.

As shown in FIG. 10, the passivation layer 9 is formed on the interlayer insulating layer 7 and the first pad 801, the second pad 802 and the third pad 803. In an exemplary embodiment, a method for forming the passivation layer 9 comprises PECVD. In an exemplary embodiment, the passivation layer 9 comprises silicon oxide or silicon nitride. In an exemplary embodiment, the passivation layer 9 has a thickness about 200-400 nm.

An embodiment of the present disclosure further provides a thin film transistor 10. The thin film transistor 10 is fabricated according to the above method for fabricating a thin film transistor and is a top gate type thin film transistor. Since plasma treatment is performed on the first conductive layer of the gate stack, and the source region and the drain region of the active layer in the top gate type thin film transistor, conductivity in the corresponding regions is improved. This can realize improvement in performance of the top gate type thin film transistor device and display effect.

An embodiment of the present disclosure further provides a display panel 20. The display panel 20 comprises the above thin film transistor 10, and can realize improvement in display effect.

An embodiment of the present disclosure further provides a display device 30. The display device 30 comprises the above display panel 20, and the display device 30 can be an AMOLED transparent display device. This can realize a transparent display and can improve the display effect of the display device.

Apparently, the person with ordinary skill in the art can make various modifications and variations to the present disclosure without departing from the spirit and the scope of the present disclosure. In this way, provided that these modifications and variations of the present disclosure belong to the scopes of the claims of the present disclosure and the equivalent technologies thereof, the present disclosure also intends to encompass these modifications and variations.

What is claimed is:

1. A method for fabricating a thin film transistor, comprising:

forming an active layer on a substrate;

forming an insulating layer on the active layer and an exposed surface of the substrate;

forming a first conductive layer on the insulating layer;

patterning the first conductive layer and the insulating layer to form a first stack on the active layer, wherein the first stack comprises a first portion of the first conductive layer and a first portion of the insulating layer, the first stack acts as a gate stack of the thin film transistor, and the active layer comprises a channel region below the gate stack and a source region and a drain region at two sides of the channel region; and performing plasma treatment on the first conductive layer, the source region, and the drain region, to improve the conductivity of the first conductive layer, the source region, and the drain region.

2. The method of claim 1, wherein the first conductive layer comprises a conductive oxide, and the active layer comprises an oxide semiconductor material.

3. The method of claim 2, wherein the plasma treatment forms oxygen vacancy in the conductive oxide and the oxide semiconductor material.

4. The method of claim 3, wherein the plasma treatment uses argon plasma or helium plasma.

5. The method of claim 3, wherein the plasma treatment comprises helium plasma treatment, and reaction conditions comprise a helium flux about 100-500 sccm, a pressure about 10-100 Pa, a power about 200-1000 W, and a treatment duration about 5-300 seconds.

6. The method of claim 5, wherein the reaction conditions comprise a helium flux about 200 sccm, a pressure about 50 Pa, a power about 600 W, and a treatment duration about 40 seconds.

7. The method of claim 2, wherein the active layer has a thickness of about 10 nm-100 nm, and the first conductive layer has a thickness of about 50 nm - 400 nm.

8. The method of claim 2, wherein the conductive oxide comprises at least one of indium tin oxide and gallium doped zinc oxide, and the oxide semiconductor material comprises at least one of indium gallium zinc oxide and indium tin zinc oxide.

9. The method of claim 1, further comprising:
prior to forming the active layer, forming a light shielding layer on the substrate; and
forming a buffer layer on the substrate and the light shielding layer.

10. The method of claim 9, wherein the light shielding layer comprises a semiconductor material which has a band gap smaller than a band gap of the active layer.

11. The method of claim 10, wherein the light shielding layer comprises indium gallium zinc oxide, the active layer comprises indium gallium zinc oxide, and the light shielding layer has an oxygen concentration lower than an oxygen concentration of the active layer.

12. The method of claim 9, wherein the buffer layer comprises silicon oxide.

13. The method of claim 1, wherein the patterning further comprises forming a second stack on the substrate which is adjacent to the active layer, the second stack comprises a second portion of the first conductive layer and a second portion of the insulating layer, and the plasma treatment further treats the second portion of the first conductive layer.

14. The method of claim 1, further comprising:
forming an interlayer insulating layer to cover the substrate, the active layer, the first stack, and the second stack;
patterning the interlayer insulating layer to form at a same time in the interlayer insulating layer a first through hole which exposes the source region, a second through hole which exposes the drain region, and a third through hole which exposes the second portion of the first conductive layer of the second stack;
forming a second electrically conductive layer on the interlayer insulating layer to fill the first, second, and third through holes;
patterning the second electrically conductive layer to form a first pad which is connected with the source region through the first through hole, a second pad which is connected with the drain region through the second through hole, and a third pad which is connected with the second portion of the first conductive layer through the third through hole; and
forming a passivation layer on the interlayer insulating layer and the first, second, and third pads.

15. The method of claim 14, wherein the interlayer insulating layer is patterned with the plasma treatment.

16. The method of claim 14, wherein the interlayer insulating layer comprises silicon oxide, the second electrically conductive layer comprises metal or conductive oxide, and the passivation layer comprises silicon oxide or silicon nitride.

17. A thin film transistor fabricated by the method of claim 1.

18. A display panel comprising the thin film transistor of claim 17.

19. A display device comprising the display panel of claim 18.

* * * * *